United States Patent
Estes et al.

(10) Patent No.: US 6,189,208 B1
(45) Date of Patent: *Feb. 20, 2001

(54) FLIP CHIP MOUNTING TECHNIQUE

(75) Inventors: Richard H. Estes, Hollis, NH (US); Koji Ito; Masanori Akita, both of Otsu (JP); Toshihiro Mori, Moriyama (JP); Minoru Wada, Ina-machi (JP)

(73) Assignees: Polymer Flip Chip Corp., Billerica, MA (US); Toray Engineering Co., Tokyo (JP)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/378,847

(22) Filed: Aug. 23, 1999

Related U.S. Application Data

(63) Continuation-in-part of application No. 09/274,748, filed on Mar. 23, 1999.

(51) Int. Cl.$^7$ ........................................ H05K 3/34
(52) U.S. Cl. ...................... 29/840; 29/740; 29/832; 174/260
(58) Field of Search ................ 29/740, 832, 840; 174/260

(56) References Cited

U.S. PATENT DOCUMENTS

| | | | |
|---|---|---|---|
| 4,157,932 | * | 6/1979 | Hirata ..................... 156/310 |
| 4,554,033 | | 11/1985 | Dery et al. ................ 156/52 |
| 4,612,083 | | 9/1986 | Yasumoto et al. ............ 156/633 |

(List continued on next page.)

FOREIGN PATENT DOCUMENTS

| | | | |
|---|---|---|---|
| 0303256 | 2/1989 | (EP) | H01L/21/60 |
| 0360971 | 4/1990 | (EP) | H05K/1/18 |
| 0620701 | 10/1994 | (EP) | H05K/3/40 |
| 60-1849 | 1/1985 | (JP) | H01L/23/32 |
| 63-122133 | 5/1988 | (JP) | H01L/21/60 |
| 2155257 | 6/1990 | (JP) | H01L/23/29 |
| 3-16147 | 1/1991 | (JP) | H01L/21/60 |
| 6-69278 | 3/1994 | (JP) | H01L/21/60 |
| 823657 | 9/1996 | (JP) | H01L/21/60 |
| 9-97815 | 4/1997 | (JP) | H01L/21/60 |
| 10-199932 | 7/1998 | (JP) | H01L/21/60 |
| 9904430 | 1/1999 | (WO) | H01L/23/48 |
| 9949507 | 9/1999 | (WO) | H01L/21/60 |

OTHER PUBLICATIONS

Estes, "Fabrication and Assembly Processes for Solderless Flip Chip Assemblies," Proc., 1992.
Int. Society For Hybrid Microelectronics Conf., pp. 322–335, San Fran., CA, Oct. 19–21, 1992.

(List continued on next page.)

*Primary Examiner*—Stephen F. Gerrity
*Assistant Examiner*—Paul D. Kim
(74) *Attorney, Agent, or Firm*—Theresa A. Lober

(57) ABSTRACT

The invention provides a flip chip mounting process in which a layer of electrically insulating adhesive paste is applied on a substrate having bond pads, covering the bond pads with the adhesive. Electrically conductive polymer bumps are formed on bond pads of a flip chip to be bonded to the substrate, and the polymer bumps are at least partially hardened. The bond pads of the flip chip are then aligned with the bond pads of the substrate, and the at least partially hardened polymer bumps are pushed through the adhesive on the substrate to contact directly and bond the polymer bumps to the bond pads of the substrate. This process results in direct electrical and mechanical bonding of the polymer bumps between the chip and substrate bond pads, even though the adhesive film was applied on the substrate in a manner that covered the substrate bond pads. The polymer bumps displace the adhesive as they are pushed through it and expand laterally on the substrate bond pads. As a result, the area around the polymer bumps between the chip and the substrate is filled with the adhesive, in the manner of an underfill, whereby a separate, post-bond underfill process is not required.

27 Claims, 2 Drawing Sheets

U.S. PATENT DOCUMENTS

| | | | |
|---|---|---|---|
| 4,640,981 | | 2/1987 | Dery et al. .................. 174/88 R |
| 4,680,226 | | 7/1987 | Takeda ......................... 428/327 |
| 4,749,120 | * | 6/1988 | Hatada .......................... 228/123 |
| 4,818,728 | * | 4/1989 | Rai ................................ 437/209 |
| 4,868,979 | | 9/1989 | Fukushima et al. ............ 29/840 |
| 4,917,466 | | 4/1990 | Nakamura at al. ............ 350/336 |
| 4,967,314 | | 10/1990 | Higgins, III ................. 361/414 |
| 5,074,947 | * | 12/1991 | Estes ........................... 156/307.3 |
| 5,084,961 | * | 2/1992 | Yoshikawa ..................... 29/840 |
| 5,086,558 | | 2/1992 | Grube et al. ................... 29/832 |
| 5,136,365 | | 8/1992 | Pennisi et al. .................. 357/72 |
| 5,147,210 | | 9/1992 | Patterson et al. .............. 439/91 |
| 5,196,371 | * | 3/1993 | Kulesza .......................... 437/183 |
| 5,237,130 | | 8/1993 | Kulesza et al. ................. 174/260 |
| 5,296,063 | * | 3/1994 | Yamamura ..................... 156/64 |
| 5,298,279 | | 3/1994 | Hayashi ......................... 427/96 |
| 5,318,651 | | 6/1994 | Matsui et al. .................. 156/273.5 |
| 5,329,423 | | 7/1994 | Scholz ........................... 361/760 |
| 5,341,564 | | 8/1994 | Akhavain et al. .............. 29/832 |
| 5,363,277 | | 11/1994 | Tanaka ........................... 316/760 |
| 5,384,952 | | 1/1995 | Matsui ........................... 29/840 |
| 5,477,419 | * | 12/1995 | Goodman ....................... 361/760 |
| 5,543,585 | * | 8/1996 | Booth ............................. 174/261 |
| 5,545,281 | * | 8/1996 | Matsui ........................... 156/273.7 |
| 5,611,140 | | 3/1997 | Kulesza et al. ................. 29/832 |
| 5,637,176 | | 6/1997 | Gilleo et al. ................... 156/277 |
| 5,667,884 | | 9/1997 | Bolger ............................ 428/323 |
| 5,674,780 | | 10/1997 | Lytle et al. ..................... 437/183 |
| 5,686,702 | | 11/1997 | Ishida ............................. 174/250 |
| 5,714,252 | | 2/1998 | Hogerton et al. .............. 428/344 |
| 5,747,101 | | 5/1998 | Booth et al. ................... 427/96 |
| 5,840,417 | | 11/1998 | Nolger ........................... 428/323 |
| 5,843,251 | * | 12/1998 | Tsukagoshi ..................... 154/64 |
| 5,861,678 | | 1/1999 | Shrock ........................... 257/783 |
| 5,863,970 | * | 1/1999 | Ghoshal ......................... 523/434 |
| 5,879,761 | | 3/1999 | Kulesza et al. ................. 427/555 |
| 5,918,364 | | 7/1999 | Kulesza et al. ................. 29/832 |
| 5,925,930 | * | 7/1999 | Farnworth ...................... 257/737 |
| 5,975,408 | * | 11/1999 | Goossen ........................ 228/173.2 |
| 6,027,575 | * | 2/2000 | Paruchuri ....................... 148/24 |

OTHER PUBLICATIONS

Kulesza et al., "Solderless Flip Chip Technology," *Hybrid Circuit Technology* Feb. 1992.

"Wafer Surface Protection Achieved with Screen Printable Polymide," Industry News, *Semiconductor International,* Jun. 1987.

EPO–TEK®600, Epoxy Technology Product Specification, Jun.1987.

EPO–TEK® H20E–PFC Electrically Conductive Silver Epoxy, Epoxy Technology Product Specification, Sep 1992.

EPO–TEK®688–PFC PFC Silicon Wafer Coating , Epoxy Technology Product Specification, Oct.1992.

Kulesza et al., "A Screen–Printable Polyimide Coating for Silicon Wafers,"0 *Solid State Technology,* Jan. 1988.

Kulesza et al., "A Better Bump. Polymers' Promise to Flip Chip Assembly,"0 *Advanced Packaging,* pp. 26–29, vol. 6, No. 6, Nov./Dec. 1997.

Hatada et al., "A New LSI Bonding Technology 'Micron Bump Bonding Assembly Technology, '"0 *5th IEEE CHMT Int. Elect. Man. Tech. Symp.* ,pp. 23–27, 1988.

Patent Abstracts of Japan, vol. 1998, No. 12, JP 10 199932 A, Fujitsu Ltd., Oct. 31, 1998.

Patent Abstracts of Japan , vol. 14. No. 222 (E–0926), JP 2054945, Toshiba Corp., May 10, 1990.

* cited by examiner

FLIP CHIP MOUNTING TECHNIQUE

This is a continuation-in-part of application Ser. No. 09/274,748, filed Mar. 23, 1999 pending.

BACKGROUND OF THE INVENTION

This invention relates to methods for electrically connecting a flip chip to a substrate.

Flip chip mounting is an increasingly popular technique for directly electrically connecting an integrated circuit chip to a substrate such as a circuit board. In this configuration, the active face of the chip is mounted face down, or "flipped" on the substrate. The electrical bond pads on the flip chip are aligned with corresponding electrical bond pads on the substrate, with the chip and substrate bond pads electrically connected by way of an electrically conductive material. The flip chip mounting technique eliminates the use of bond wires between a chip or chip package and the substrate, resulting in increased reliability of the chip-to-substrate bond.

A wide range of electrically conducting compositions have been proposed for making the interconnection between flip chip and substrate bond pads. Solder balls, gold bumps, gold stud bumps, and other conventional metal bump configurations have been used extensively. Aside from metallic compositions, electrically conducting polymer compositions are gaining wide acceptance as flip chip interconnection bump materials. In a flip chip mounting technique employing polymer interconnections, electrically conductive polymer bumps are formed on the bond pads, typically of the flip chip, and are polymerized or dried during bonding to the substrate bond pads, whereby both an electrical and a mechanical adhesive bond between the flip chip and the substrate bond pads is produced. Electrically conductive polymer materials are particularly well-suited for flip chip mounting techniques because of their ease of application, because they eliminate many of the unwanted characteristics of metallic interconnections, e.g., solder flux, and because for some polymer materials reworkability of faulty flip chips is enabled by simple heating of the material.

Conventionally, once a flip chip is bonded to a substrate, whether by metallic or by polymer bump interconnections between the chip and substrate bond pads, an underfill material is dispensed between the chip and the substrate. The underfill material is typically provided as a liquid adhesive resin that can be dried or polymerized. The underfill material provides enhanced mechanical adhesion and mechanical and thermal stability between the flip chip and the substrate, and inhibits environmental attack of chip and substrate surfaces.

SUMMARY OF THE INVENTION

The invention provides a process that exploits the superior bonding capabilities of electrically conductive polymer materials for bonding a flip chip to a substrate while providing a highly efficient and effective technique that eliminates the need for conventional post-bond underfill dispensing operations. In this process, a layer of electrically insulating adhesive paste is applied on a substrate having bond pads, covering the bond pads with the adhesive. Electrically conductive polymer bumps are formed on bond pads of a flip chip to be bonded to the substrate, and the polymer bumps are at least partially hardened. The bond pads of the flip chip are then aligned with the bond pads of the substrate, and the at least partially hardened polymer bumps are pushed through the adhesive on the substrate to contact directly and bond the polymer bumps to the bond pads of the substrate.

This process results in direct electrical and mechanical bonding of the polymer bumps between the chip and substrate bond pads, even though the adhesive film was applied on the substrate in a manner that covered the substrate bond pads. The polymer bumps displace the adhesive as they are pushed through it and expand laterally on the substrate bond pads. As a result, the area around the polymer bumps between the chip and the substrate is filled with the adhesive, in the manner of an underfill. A separate, post-bond underfill process is therefore not required. The particular performance advantages of polymer bump material provided by the invention, in combination with the highly efficient adhesive underfill application process provided by the invention, render this flip chip mounting process superior to conventional mounting techniques.

In embodiments provided by the invention, the adhesive paste applied to the substrate can be at least partially dried or at least partially cured, as appropriate for the selected paste material, before the step of pushing the polymer bumps through the adhesive on the substrate. Similarly, the step of at least partially hardening the polymer bumps can be carried out by at least partially drying or by at least partially polymerizing the polymer bumps, as appropriate for the selected bump material.

In further embodiments provided by the invention, heat is applied to the flip chip as the bumps are pushed through the adhesive on the substrate. Heat can also be applied to the flip chip after the polymer bumps contact the bond pads of the substrate. Pressure is preferably applied to the flip chip during the bonding process for a selected duration, based on material characteristics of the adhesive and of the polymer bumps, that vertically compresses the bumps between the flip chip and the substrate to a compressed height that is less than bump height as-formed; e.g., resulting in a compressed bump height that is less than about 80% of bump height as-formed. The polymer bumps, as-formed, preferably have a bump height that is greater than the adhesive paste thickness as-applied on the substrate, more preferably having a bump height that is at least about 25% greater than the adhesive paste thickness.

The polymer bumps and the adhesive paste can each be formed of, e.g., a thermoplastic material, a thermoset material, or a B-stage thermoset material. The polymer bumps can include hard particles, preferably that have jagged edges which protrude from the bump. Such particles can be electrically conductive or electrically nonconductive. The adhesive material can include a solvent to aid in its application to the substrate.

Both the polymer bump formation and the adhesive application to the substrate can be carried out by, e.g., a stenciling process or a screen printing process. The adhesive can further be applied by, e.g., a dispensing or by a spin-coating process.

The flip chip mounting technique of the invention is widely applicable to a range of substrate materials and flip chip mounting configurations. The flexibility in adhesive application and polymer bump formation methods allow for versatility in material formulation for application-specific considerations. In general, the flip chip mounting technique can be employed as a superior alternative for most conventional flip chip mounting processes that employ solder or other metallic bumps and conventional post-bond underfill processes, resulting in enhanced mounting quality and improved process efficiency.

Other features and advantages of the flip chip mounting method of the invention will be apparent from the following description and accompanying drawing, and from the claims.

DETAILED DESCRIPTION OF THE INVENTION

Figure 1:
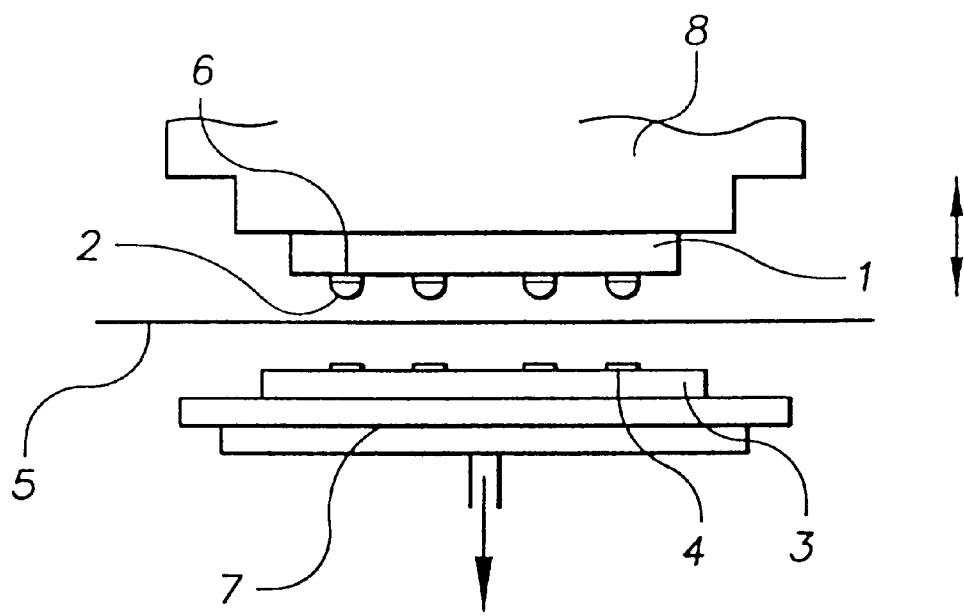
FIG. 1 is a schematic cross-sectional view of a flip chip being mounted to a substrate by a method in accordance with the invention.

As indicated in FIG. 1, with this invention, polymer bumps 2 of an IC chip 1 are directly bonded to the electrodes, i.e., bond pads, 4 of a substrate 3, such as a circuit board, with an electrically insulating adhesive 5 located between the IC chip 1 and the circuit board.

The IC chip is a flip chip, in that the active surface of the chip is bonded face down on the substrate. The polymer bumps 2 are therefore applied to electrode pads of the flip chip on the active surface of the chip. As explained in detail below, direct bonding of the flip chip polymer bumps to the substrate electrodes is accomplished in accordance with the invention by pushing the polymer bumps through the adhesive on the substrate to displace the adhesive in the area of the substrate electrodes such that the polymer bumps are directly bonded to the substrate electrodes. The adhesive around the bonded polymer bumps underfills the volume between the chip and the substrate, and thereby eliminates the need for a post-bond underfill dispensing step.

The polymer bumps are formed by, e.g., stenciling electrically-conductive paste on the electrode pads 6, i.e., bond pads, of the IC chip 1. A metal mask is satisfactory as a plate material for this stenciling of the polymer bumps on the bond pads.

The invention contemplates additional techniques for producing polymer bumps on the bond pads of the flip chip. Screen printing, dispensing, transfer printing, laser jetting, roller coating, vacuum suction through a stencil, photolithographic techniques, and other processes can be employed, in the known conventional manner, and as described below with regard to adhesive application to the substrate, to produce polymer bumps on the bond pads of the flip chip. For many applications, a stenciling process is particularly well-suited due to its ease of control and precision. It is preferred that the polymer bumps be formed on flip chips in wafer form, prior to dicing of the wafer, but such is not required.

Whatever process is selected to form the polymer bumps on the chip bond pads, it is preferred that any oxidizing layer present on the bond pads first be removed, in the conventional manner, and that a layer of a good electrically conducting material be applied to the bond pads. For example, a layer of nickel, nickel-gold, palladium, or other conductor is preferably applied to the bond pads by, e.g., a sputtering, electroplating, or other suitable technique, as is conventional.

Heat-curable resin paste, e.g., epoxy resin paste or other such resin paste, containing electrically-conductive particles, e.g., silver particles, or other such material, can be used as the electrically-conductive paste. Specifically, the polymer bumps can be formed of any of a thermoset, B-stage thermoset, thermoplastic, or other suitable polymer, in each case provided as an electrically conducting polymer by, e.g., the addition of particles, flakes, or other form of an electrically conducting material, e.g., Ag, Ag—Pd, Au, Cu, Ni, or other suitable conducting material to the polymer. It is preferred that the selected polymer bump material be characterized by a relatively high glass transition temperature, such that the bumps remain mechanically robust in the process of directly connecting the polymer bumps to the substrate electrodes by displacing the adhesive on the substrate, in the manner described in detail below.

Well-suited materials for producing polymer bumps include EPO-TEK® E3084PFC and EPO-TEK® H20E175PFC-1, both of which have glass transition temperatures above about 175° C.; EPO-TEK® E2101, EPO-TEK® H20EPFC, and EPO-TEK® E3114PFC, all of which have glass transition temperatures between about 110° C. and about 130° C.; EPO-TEK® K5022-115BE and EPO-TEK® K5022-115BG, both of which are thermoplastic materials having a melting point that is less than about 170° C.; and EPO-TEK® EE149-6, which is a B-stage thermoset having a glass transition temperature of between about 130° C. and about 150° C.

Preferably, the condition of the polymer bump material is that when formed as a bump, the material has sufficient hardness and sufficient morphological features to adequately push through and displace the insulating adhesive on a substrate to which the chip is being mounted, to enable direct connection of the bump to the substrate electrode. Specifically, the bumps should not be coined, i.e., flattened, by the bump forming process. Instead, the bumps preferably are characterized as being substantially half-hemispherical, or cone-shaped or otherwise pointed. Such enables ease of adhesive displacement as the bumps are pushed through the adhesive. This is further enabled if the polymer bumps are characterized by a relatively high Shore-D hardness, e.g., between about 70 and about 90.

The mechanical robustness of the bumps is to be enhanced, in accordance with the invention, once the bumps are formed on the chip, by fully or partially curing the bumps, if formed of a curable, i.e., polymerizable, material, or by fully or partially drying the bumps, if of a thermoplastic material. Correspondingly, reference hereinafter to a process of at least partially "hardening" polymer bumps is meant to refer to any of the processes of partially or fully curing or drying the bumps, depending on the bump composition. For example, a thermoset material can be partially cured by subjecting it to a temperature of about 150° C. for about 15 minutes; a B-stage thermoset material can be at least partially dried by subjecting it to a temperature of about 75° C. for between about 30 minutes to about 40 minutes; and the solvents in a thermoplastic material can be driven off to at least partially dry the material by subjecting it to a temperature of about 100° C. for about 1 hour. These example bump hardening process conditions produce a bump material of sufficient mechanical robustness to successfully push through and displace adhesive on a substrate. Whatever polymerization or drying process conditions are employed, it is preferable that they provide an adequate degree of drying or partial polymerization that renders the polymer, in bump form, sufficiently mechanically robust to push through the adhesive on a substrate.

If the selected polymer bump material is curable, is not necessarily required to be heat-curable, i.e., polymerizable by heat. Polymer bump material that is polymerized at room temperature or with, e.g., microwave energy, can be employed. Polymer bump material that is photocurable by exposure to, e.g., visible light, an E-beam, or ultraviolet light, can also be employed. If reworkability of a mounted flip chip is important for a given application, then a polymer bump material that is not at all cured, e.g., a thermoplastic, is preferred.

The bump hardness and morphology can be further enhanced by including relatively hard, irregularly-shaped, sharp-edged, abrasive particles in the bump material. When substantially homogeneously mixed in the material, as-formed in a bump, some of the particles' edges can be expected to protrude from the bump surface, forming jagged bump edges that enhance the ability of the bump to push through and displace the insulating adhesive. Such an additive can be electrically conducting or insulating. Preferably the added hard particles are less than about 20 $\mu$m in diameter, and more preferably the diameter distribution of the particles is between about 3 $\mu$m and about 13 $\mu$m.

Well-suited additives include particles, such as flakes, of diamond, either natural or synthetic, boron nitride, aluminum nitride, aluminum oxide, quartz, nickel, silica, and mica, as well as gold flake, palladium flake, silver flake, and powdered electrically conductive or insulating epoxy resin that has been cured and ground, and other suitable particle, powder, or flake materials that are characterized by relatively high degree of hardness. Requirements of a given application must be considered in selecting a suitable additive. For example, if electrical conductivity is of highest consideration, then powdered electrically conductive epoxy resin can be the preferable additive. In general, the harder an additive material, the less must be incorporated in the polymer bump to enhance the mechanical properties of the bump. As a result, nonconducting additives such as diamond and the less costly aluminum oxide can be preferred due to the very small amounts required to be added to achieve enhanced mechanical properties while minimally impacting on the electrical properties of the bump.

For some applications, electrically conductive material added to the bump polymer material to render it electrically conducting will itself provide irregularly-shaped, sharp-edged, abrasive particles. For example, silver flake, although not as hard as, e.g., diamond, when included in a polymer bump to produce electrical conductivity of the bump will produce surface jaggedness and irregularities that enhance the ability of the bump to pierce through and displace the substrate adhesive. It is contemplated in accordance with the invention that additional hard particles beyond the particles included for electrical conductivity of the polymer are to be added to enhance the mechanical properties of the polymer, if such enhancement is desired.

While the hardness of the included particles is of importance, the jagged irregularities of the particles extending from the bump are found to particularly aid in piercing and displacing adhesive as the bump is pushed through the adhesive. Plating of the polymer bump surface with a hard material, rather than inclusion of hard particles in the bump, is not contemplated by the invention, as this alternative is found to not be effective. A hard but generally smooth plating surface does not aid in piercing and displacing adhesive through which the bump is pushed. In addition, given that the bump surface is substantially coated with the plating material, the plating can compromise the electrical conductivity of the bump. Furthermore, a bump plating surface can limit the lateral expansion of the bump as it is pressed against a substrate electrode. As explained in detail below, the polymer bump is a particularly effective interconnection in that the bump laterally expands as it is pressed between a chip and a substrate, whereby the polymer bump covers more of the area of a bond pad than would, say, a conventional metal bump. Limitation of the bump lateral expansion by a plating surface is to be avoided as the reduced bump surface area on the bond pad would result in lower adhesion to the bond pad as well as a higher electrical contact resistance through the bump.

Turning now to the electrically insulating adhesive, the adhesive 5 applied to the substrate can be, e.g., a heat-curable material, such as a thermoset or a B-stage thermoset, a thermoplastic material, or a mixture of the two. The preferred alternative is that of a heat-curable electrically insulating adhesive film. The form of this film is, e.g., a single sheet, but laminated films, or other films, can be used.

It is preferred in accordance with the invention, in general, that the insulating adhesive be substantially completely electrically nonconductive, and be substantially nonvoiding, i.e., not characterized by a tendency to form voids. Because the insulating adhesive eliminates the need for application of a conventional underfill material between the chip and substrate after the chip is bonded to the substrate, it is contemplated by the invention that the adhesive be characterized by the material properties that are desirable for an underfill material, such as relatively high modulus, low coefficient of thermal expansion, and high glass transition temperature. Preferably the adhesive can be snap cured, i.e., polymerized, if curing is desired, but such is not required. Also, if the adhesive is provided as a thermoset or B-stage thermoset, then the adhesive is preferably characterized by a tendency to shrink during polymerization in the chip bonding process, such that the polymer bumps and the chip are held in compression against the substrate. This condition of compression aids in the lateral expansion of the polymer bumps as described above, and maximizes the electrical, mechanical, and dimensional integrity of the direct bond between the polymer bumps and the substrate electrodes, as well as between the chip and the substrate.

If the adhesive is provided as a thermoplastic, it preferably is characterized by a tendency to be easily softened by a heated polymer bump being pushed through the material, whereby the bump can be easily compressed and laterally expanded by pressure applied to the chip on which the bump is connected. This results in maximization of the electrical, mechanical, and dimensional bond integrity in the manner enabled by thermoset and B-stage thermoset materials.

The substrate adhesive can contain a thermally-conductive filler, e.g., aluminum oxide, and/or an insulating filler, such as silica particles, but such is not required. The adhesive further can contain a spacer material that is of a dimensional regime corresponding to a desired chip-to-substrate distance when the chip is bonded to the substrate. Example spacer materials include glass beads, polystyrene particles, or other materials mixed in with the adhesive to set a minimum adhesive thickness once applied to a substrate.

Whatever filler condition is selected, preferably the resulting adhesive is characterized by a relatively high glass transition temperature, e.g., between about 120° C. and about 175° C.; a relatively low thermal expansion coefficient, e.g., between about 10 ppm/° C. and about 40 ppm/° C.; a relatively high temperature degradation temperature, e.g., greater than about 350° C.; and by low outgassing, e.g., less than about 1.0% at about 300° C.

The invention contemplates the provision of the adhesive material in forms other than the single sheet or laminated sheet films mentioned above, and in a range of compositions. Whatever composition is provided, in accordance with the invention the composition is characterized as a paste when it is applied to the substrate. As herein specified, a paste is of sufficient viscosity that it does not readily flow, in the nature of a conventional liquid, once applied to a substrate. But the thixotropy of the paste can be broken by application forces, e.g., shear forces, during the application process, such that the paste becomes fluid enough to be applied, e.g., through a mesh screen, in the manner described below. A paste therefore enables application in a somewhat liquid state, but once applied tends to hold its as-applied shape.

A first general class of adhesive compositions provided by the invention is that of an electrically nonconductive film material, i.e., a material that has been rendered as a dry, non-tacky film after application to a substrate as a paste. The nonconductive film material can include a solvent as-applied to the substrate to aid in application to the substrate, which can be carried out by any of a range of techniques as described below. Examples of suitable nonconductive film materials are thermoplastics, B-stage thermosets, mixtures of the two, and other like compositions. One particularly well-suited thermoplastic material is EPO-TEK® K5022-115BT2, available from Epoxy Technology, of Billerica, Mass. Several particularly well-suited B-stage thermoset materials are EPO-TEK® TE154-8, EPO-TEK® TE154-9, EPO-TEK® TE154-10, EPO-TEK® TE154-15, EPO-TEK® B9021-1, and EPO-TEK® B9021-6, all available from Epoxy Technology, of Billerica, Mass.

Once a selected B-stage thermoset or thermoplastic material is applied to the substrate, solvent in the material, if present, is removed from the material to form a solvent-free, partially- or fully-dried adhesive film. A B-stage thermoset material can be dried by subjecting it to, e.g., a temperature of about 75° C. for between about 30 minutes to about 40 minutes. The solvent can be driven from a thermoplastic material by subjecting it to, e.g., a temperature of about 100° C. for about 1 hour. These example processes are intended only as general guidelines and it is to be recognized that the particular conditions of a given material must be considered in selecting process parameters.

A second general class of adhesive compositions provided by the invention is that of an electrically nonconductive paste material, i.e., a material that is maintained as a paste after it has been applied to a substrate. Example paste materials include thermosets and hot melt thermoplastics. Preferably the selected paste material does not include a solvent, which could likely result in voiding of the material after application to a substrate. The selected nonconductive paste material is applied to a substrate, in the manner described below, without a drying step; the material therefore remains as an adhesive paste, rather than a dry adhesive film.

Thus the distinction between nonconductive pastes of the invention and nonconductive films of the invention is that the nonconductive films are pastes that have been rendered dry or solvent-free, and therefore are in a non-tacky state in which they can be handled, whereas the undried pastes are maintained as such. Given these distinctions, the adhesive material to be employed for a given application is therefore preferably selected based on the particular needs of the application. For example, a bonding process employing a dried nonconductive film requires an added drying step, but enables the pre-production of substrates with the film for introduction into a production line that cannot accommodate an insulating adhesive application step. A bonding process employing a nonconductive paste does not accommodate handling of the substrates, but requires fewer process steps and enables a polymer bump bonding process that requires less chip pressure than for a nonconductive paste adhesive process.

Several thermosets that are particularly well-suited as nonconductive paste materials include EPO-TEK® TE179-1, EPO-TEK® TE179-2, EPO-TEK® TE179-3, EPO-TEK® T6116M, EPO-TEK® B9126-20, EPO-TEK® 353NDT, and EPO-TEK® 115SMT, all available from Epoxy Technology of Billerica, Mass. In general, it is preferred that whatever thermoset is selected, it is characterized by a relatively high modulus, e.g., greater than about 10 GPa.

In general, if the selected substrate is of a flexible material, e.g., polyester, then a thermoplastic adhesive is preferably employed to maintain the flexible nature of the substrate. If a rigid substrate, e.g., a circuit board, is selected, then a thermoset or B-stage thermoset adhesive can be preferable. For any substrate material, if reworkability of flip chips is required, then a thermoplastic adhesive is preferred.

The selected adhesive material can be applied to a substrate in any of a range of techniques provided by the invention. All techniques meet the common requirement that they form a layer of adhesive that substantially entirely covers the substrate area at which a chip is to be bonded, including the bond pads of the substrate. The substrate bond pads are not exposed; they are covered by the adhesive. It is not required to form the adhesive on the substrate in an exact pattern correlation with the expected chip area. It is preferable, however, that the applied adhesive area on the substrate be at least slightly larger than the area of the chip to be attached.

In one example technique, already mentioned above, and generally limited to the class of B-stage thermoset and thermoplastic nonconductive films described above, the film is applied to a stand-alone carrier substrate and then partially or fully dried or cured. After drying or curing, the film is cut to a selected size and shape and then transferred to the intended working substrate destination. Care must be exercised to ensure that air gaps are not formed between the film and the substrate, particularly in the areas of the substrate bond pads.

For many applications, it can be more preferable to employ a screen print or stencil operation that enables application of an adhesive material directly to an intended working substrate. Such application techniques substantially eliminate the production of voids, or air gaps, between the adhesive and the substrate at the location of the substrate bond pads. Both screen printing and stenciling operations are particularly well-suited for use with adhesive materials that include a solvent as-applied to the substrate; the solvent lowers the viscosity of the material, thereby aiding in effective printing or stenciling of the material.

In an example screen printing process provided by the invention, the selected adhesive material, e.g., any of the thermoset, B-stage thermoset, or thermoplastic materials given above, is squeegeed through a wire mesh screen using, e.g., a metal or polymer-based squeegee, onto the intended substrate. The screen can be formed in the conventional manner, of, e.g., stainless steel or other metal, or a polyester-type plastic.

In the conventional manner, the diameter of the wire mesh is selected based on the selected adhesive thickness. For many applications, it is desirable to provide an emulsion pattern on the screen to define the adhesive application area on the substrate. Such an emulsion pattern can be provided, in the conventional manner, on the bottom side of the screen. The emulsion thickness, like the wire mesh diameter, is preferably selected, in the conventional manner, based on the selected adhesive thickness. If the wire mesh is too thick for a desired adhesive thickness, and/or the emulsion is too thin for a desired adhesive thickness, gaps in the adhesive can be formed on the substrate at the location of cross-over of the mesh wires. The general rheology of a selected adhesive material must also be considered with regard to the screen wire diameter and the screen emulsion thickness. With proper selection of wire mesh diameter and emulsion thickness for a selected adhesive thickness, complete coverage of a substrate by a screen printing process can be achieved.

In a stencil operation provided by the invention for applying adhesive material of e.g., thermoset, B-stage thermoset, or thermoplastic directly to a substrate, the adhesive material is pushed by a squeegee through open holes provided in a metal stencil onto the intended working substrate. The metal stencil thickness is selected, in the conventional manner, based on the selected adhesive thickness. The squeegee can be formed of, e.g., metal or polymer. The openings in the stencil can be formed by, e.g., a subtractive chemical etch process, a subtractive laser etch process, an additive electroforming process, or other suitable stencil patterning forming technique.

For many applications, screen printing can be preferable to stenciling given the relatively large substrate area over which the adhesive material is to be applied. Conversely, for applications employing a relatively thin layer of adhesive, stenciling can be preferable to eliminate the formation of voids in the adhesive at the cross-over locations of a screen printing wire mesh. Stenciling operations also can be expected to be more reliable over the life of a production line in that unlike a mesh screen, a metal stencil general does not clog with material being stenciled and exhibits a longer operational time to fatigue.

Alternative to screen printing and stenciling operations, the invention further provides a dispensing operation for applying the adhesive material as, e.g., a thermoset, B-stage thermoset, or thermoplastic, directly to an intended working substrate. Here the selected adhesive material is dispensed from a dispenser onto the substrate. The dispenser can be provided as, e.g., a single needle, or a showerhead needle of multiple parallel dispensing points, or other suitable needle configuration. Dispenser pumps can be provided as conventional air piston or positive displacement pump configurations. Whether configured as a single needle, showerhead needle, or other configuration, the dispenser is preferably controlled to produce a selected dispensed drop pattern on the substrate at each chip attachment location on the substrate. Suitable patterns include concentric circles and squares of dispensed drops, centered at the locations of chip attachment to the substrate; but it is to be recognized that lines of dispensed drops and complex patterns of dispensed drops can be preferable for some applications. The needle diameter and the volume of adhesive pushed out of the needle during one dispensing operation determine the dispensed drop dimensions. In general, a single needle dispenser is preferred over a showerhead needle for its ability to produce a dispensed drop that reliably expands to provide continuous coverage of a selected substrate area.

In a further adhesive material application process provided by the invention, a polymer such as a thermoset, B-stage thermoset, or thermoplastic adhesive material is applied to an intended working substrate by a transfer print, pad print, stamp print, or roller print process. In general, in all of these operations, a transfer element is employed to pick up, or collect, the selected adhesive from an adhesive reservoir and then to deposit the collected adhesive on the intended working substrate. The adhesive is released from the transfer element to the substrate typically as a result of differing surface tensions between the adhesive and the substrate and the transfer element and the adhesive.

The transfer element can be provided as, e.g., a patterned pad of suitable material such as metal or rubber, as a patterned roller, as an array of pins fastened to a support plate, or other configuration in which can be provided a differentiated pattern. The pattern preferably corresponds to the chip attachment locations on the substrate. If a patterned roller coater is employed, it is preferably designed such that adhesive is collected on a patterned portion of the roller when the roller is rolled through an adhesive reservoir, the patterned portion then applying the adhesive to the substrate when the substrate is passed under the roller or the roller is passed over the substrate.

In a further adhesive material application technique, a selected adhesive material, here specifically a thermoset polymer, is spin-coated on the substrate. A solvent-based adhesive is here preferably employed to enable spread of the material and to maximize planarity across the substrate. Conventional spin-coating process parameters can here be employed. For some applications it can be preferable to apply multiple layers of spin-coated material to the substrate to obtain a desired adhesive layer thickness.

It is to be recognized that the details of the adhesive material application techniques just described are applicable to the corresponding polymer bump formation techniques earlier described.

The invention is not limited to the example adhesive material application operations described above. All that is required is a technique that enables the formation of a selected adhesive on an intended working substrate at locations of the substrate corresponding to chip attachment areas with the adhesive coating, i.e., covering, the bond pads of the substrate so that the bond pads are not exposed through the adhesive. It is preferable that the viscosity and the specific gravity of a selected adhesive material be tailored for a selected adhesive application technique. For screen printing and stenciling operations, the adhesive preferably is characterized by relatively high viscosity and thixotropy. For dispensing operations, the adhesive preferably is characterized by relatively low to medium viscosity and by relatively high thixotropy. For transfer printing and for spin coating operations, the adhesive preferably is characterized by relatively low viscosity and by relatively medium thixotropy.

It is preferred in accordance with the invention that the adhesive material be applied to the substrate rather than the chip. Adhesive material application to the substrate prior to attachment of any components to the substrate enables the production of a uniform and planar layer of adhesive across the extent of the substrate, resulting in repeatable, reliable mechanical and electrical characteristics of the chip-to-substrate bond.

Furthermore, most adhesive application techniques, like various of the example techniques described above, are not optimally compatible with application on a chip or wafer on which has been formed interconnection bumps. Most adhesive application processes are likely to destroy or irreparably damage the bumps. Those techniques that might not damage the bumps, e.g., adhesive dispensing, are not feasible at either the wafer or chip levels; the dicing of the wafer would likely damage the adhesive and dispensing on single chips is not practical; the dispensed paste cannot be reliably maintained on the chip. Even if adhesive application could be reliably carried out on a bumped chip or wafer, such would negate the ability to verify the functionality of the chip just prior to its attachment to a substrate. It is therefore contemplated in accordance with the invention that the adhesive material be applied to the intended working substrate, not the chip, and that the interconnection bumps be applied to the chip, not the working substrate.

Figure 2:
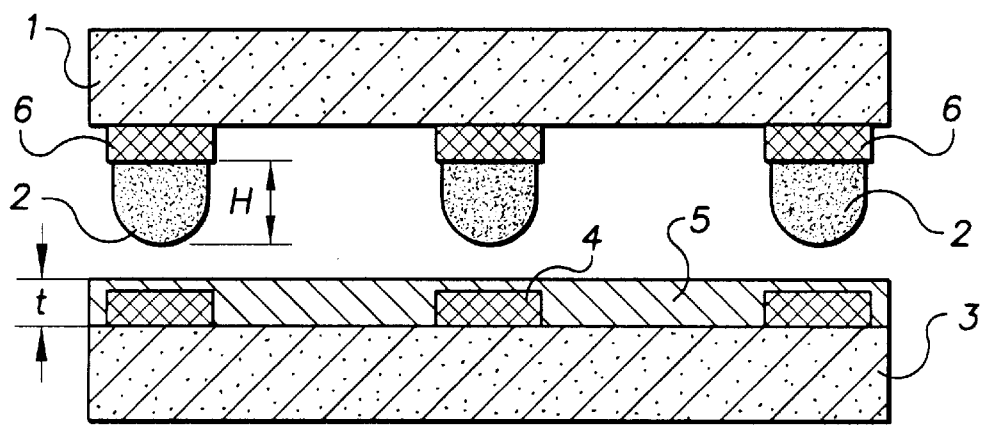
FIG. 2 is a schematic cross-sectional view of a flip chip held above a substrate, identifying the height, H, of a polymer bump on a flip chip bond pad and identifying the thickness, t, of a layer of adhesive on the substrate.

Referring to FIG. 2, in accordance with the invention, the thickness of the applied layer of adhesive on the substrate is to be selected in tandem with the height of the polymer bumps formed on the flip chip. It is to be recognized that the bump diameter and the Shore-D of the bump must be considered in selecting the bump height, but in general, the height, H, of a polymer bump is preferably greater than the thickness, t, of the layer of adhesive. In the figure, the heights of the chip bond pads 6 and the substrate electrodes 4 are greatly exaggerated; under typical conditions, the bump height and the adhesive layer can be specified to meet this condition while neglecting the electrode and bond pad heights. If a higher degree of precision is desired, then the height, H, should include the height of the bump as well as the height of the bond pad supporting the bump on the chip. It is further to be recognized that for any bump height, the adhesive layer must cover the substrate bond pads and thus must be at least as thick as the height of the substrate bond pads.

A condition in which the bump height is greater than the adhesive thickness ensures two desirable conditions. First, it ensures that when the chip is pressed against the adhesive layer on the substrate, the bumps do not act as stand-offs holding the chip above the adhesive layer. Contact of the face of the chip with the adhesive layer is required for the adhesive layer to act as an underfill that fills the distance between the chip face and the substrate. Secondly, it ensures that the bump will be vertically compressed between the chip and the substrate when the face of the chip is pushed until it is in contact with the top of the adhesive layer. This results in the desirable lateral expansion of the chip on the bond pad, a preferable condition as explained above.

A bump height greater than adhesive layer thickness therefore maximizes the mechanical and electrical integrity of both the chip and bump bond. Such cannot be reliably expected if the bump is not compressed, a condition that would occur if the bump height is less than or the same as the adhesive layer thickness. The optimal bump height for a given adhesive layer thickness is preferably selected based on considerations for a given application, but in general, a larger bump height is better than a smaller bump height, and a bump height compression of between about 20% and about 50%, i.e., a compressed bump height of between about 50% and about 80% of pre-bonded bump height, is desirable. For many applications the bump height is optimally about twice the thickness of the adhesive layer. In one example, a bump height of about 50 μm is employed and an adhesive thickness of about 25 μm is employed.

It is preferred that the substrate 3, if a circuit board, be a resin film, i.e., polymeric, board, but other types of substrates can be used. For example, the substrate can be formed of polyimide, paper, epoxy glass, plastic, ceramic, acetylbutylstyrene(ABS), polyester (PET), polyvinylchloride (PVC), and other suitable substrate materials.

Referring back to FIG. 1, it is preferred that the substrate be held via suction, i.e., vacuum, on a suction stage 7 to prevent the substrate from shifting as pressure is applied to the chip against the substrate during the bonding process. Such suction is particularly important for bonding chips to relatively flexible substrates such as polyimide. In one particularly well-suited configuration, the suction stage is provided as a metal plate having an array of holes through the thickness of the plate, through which suction can be drawn against the substrate. An array of suction holes enables a uniform degree of suction across the substrate, in turn reducing the possibility of bending or wrinkling thin and flexible substrates. It is also found to be preferable to apply a reduced level of suction through many holes rather than to apply an increased level of suction through only a few or one hole. In the latter instance, a condition of bending or wrinkling of a thin substrate is difficult to avoid.

For an application in which a nonconducting film is first formed on a carrier substrate and then applied to an intended working substrate, when the substrate 3 is held via suction on a suction stage 7, it is best if the insulating adhesive film 5 is first set on the substrate 3, with heat thereafter applied while pressing the film against the substrate 3, for an application in which a nonconductive film is first formed and then applied to the substrate. Bonding of the film to the substrate can then be accomplished after bringing the film into close contact with the electrodes 4 of the circuit board 3 using the suction in this way. Applying heat, e.g., a heating temperature of about 80° C., while pressing the insulating adhesive film 5 against the substrate 3 can be accomplished using a reserve heating tool, and then bonding of the flip chip to the substrate can be accomplished using a bonding tool 8. This procedure is not required for the other adhesive application techniques described above.

The bonding tool 8 is preferably mounted to enable movement of the tool in all three axis directions, X, Y, and Z, as well as rotation to a specified angle. Furthermore, the bonding tool preferably has a built-in heater (not indicated in the figure), and is set to enable vacuum suction holding of the IC chip 1 to the tool 8.

Once the adhesive layer has been applied to the substrate in the desired manner, an individual flip chip, having polymer bumps formed on the chip bond pads in the manner described above, is provided on the bonding tool 8, typically, e.g., a collet, and heated to the desired bonding temperature. Preheating of the chip is not required by the invention, but can be preferred for many bonding applications, because heated polymer bumps are characterized by a relatively lower viscosity and a corresponding increased ability to penetrate the substrate adhesive. If preheating is to be carried out, such is preferably maintained until the heat is transferred completely through the chip and the polymer bumps on the chip.

Thereafter, heat-pressure attachment, i.e., bonding, is achieved by precisely positioning the polymer bumps 2 of the IC chip 1 on the electrodes 4 of the underlying circuit board. This requires the lateral alignment of the chip bond pads with the substrate bond pads. In one example configuration, this can be achieved by employing fiducials on the chip and the substrate, in the conventional manner, in an alignment process employing an upper microscope and a lower microscope, with a camera, e.g., a CCD camera, provided for controlling the alignment process.

Once the respective bond pads of the chip and substrate are aligned, bonding can be satisfactorily achieved by piercing through the insulating film 5 with the polymer bumps 2 of the IC chip 1. The heating temperature and the pressure for the bonding are preferably controlled to specified values. As explained above, as each polymer bump is pushed through the adhesive 5 it displaces the adhesive in the region of its path such that the polymer bump makes direct contact with a corresponding substrate electrode. Application of pressure to the chip is maintained at least until the chip face is in contact with the top surface of the adhesive on the substrate and the polymer bumps of the chip are in contact with the substrate electrodes.

With chip heating maintained during the bonding, the chip surface wets the adhesive upon contact with the layer. If the adhesive material is a thermoset or B-stage thermoset, conduction of heat from the chip and bumps to the adhesive layer cures the adhesive, causing the adhesive layer to shrink and pull the bumps and chip into compression against the substrate. Compression of the chip against the adhesive layer is desirable, as explained above, to ensure that no gap space exists between the chip and the substrate, i.e., to ensure that the adhesive layer is completely filling the distance between the chip and the substrate. Compression of the chip further ensures that the polymer bumps are compressed and laterally expanded on substrate bond pads, whereby lateral gaps between the bumps and the adhesive are eliminated.

If the adhesive material is a thermoplastic, it is softened by the heated bumps as they push through it. As a result, pressure applied to the chip compresses the bumps and laterally expands the bumps in the manner described above, resulting in an equally effective bond.

In accordance with the invention, a heating schedule can be selected in which no preheating of the chip and bumps is carried out. Alternatively, the polymer bumps can be fully pushed through the adhesive and contacted to the substrate electrodes prior to heating of the completed assembly for curing the adhesive.

The following guidelines are examples of parameter values that can be generally applied to the bonding process, with the caveat that the chemistry of particular polymer bump and adhesive materials employed in the bonding process must be considered:

| Parameter | Range of Values |
| --- | --- |
| Adhesive Film Thickness | 25 μm–75 μm |
| Polymer Bump Height | 50 μm–150 μm |
| Polymer Bump Hardness | Shore-D 70–90 |
| Bond Temperature | 150° C.–350° C. |
| Bond Pressure | 10 grams–1000 grams |
| Pressure Dwell Time | 0.3 seconds–5 seconds |
| Bump Compression | 20%–50% |
| Contact Coverage of Bump on Electrode | >50% |

It is to be recognized that consideration must also be made for the number of polymer bumps to be bonded between a given chip and a substrate and the bond pressure required for each bump. Because the required bond pressure of each bump is cumulative to the chip, a relatively high total pressure can be required on the chip to enable bonding of all chip bumps. This can result in damage to the chip where very large numbers of bumps are provided. It is therefore preferable to determine the total pressure necessary for bonding the total number of polymer bumps of a chip and then to verify that the required total pressure will not damage the chip. If damage appears to be possible, a reduced pressure application is warranted, with compensating adjustment of materials properties as required.

Figure 3:
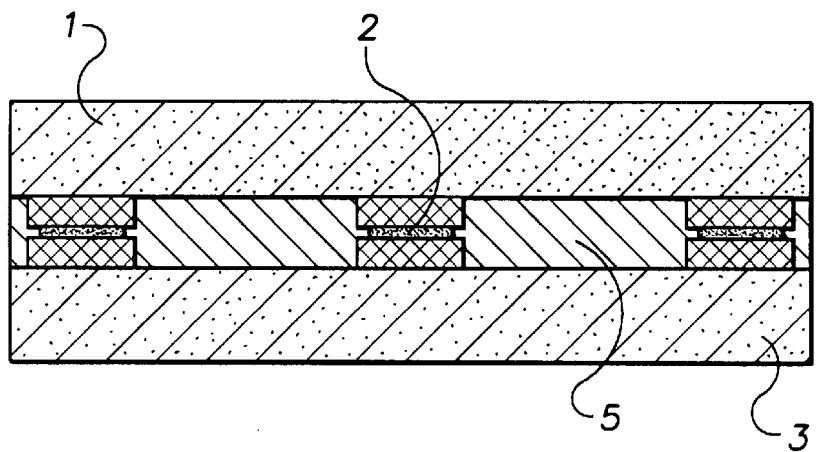
FIG. 3 is a schematic cross-sectional view of a flip chip bonded to a substrate by a method in accordance with the invention.

Referring to FIG. 3, once the bonding process is complete, the polymer bumps 2 are directly connected between the bond pads 6 of the flip chip and the electrodes 4 of the substrate. There is no electrically insulating adhesive between the bond pads and electrodes—only the polymer bump material. The entire region surrounding the polymer bumps between the chip and the substrate is filled by the adhesive; as a result, no gaps exist between the chip and the substrate. The adhesive layer thereby functions as an underfill material between the chip and the substrate. No additional material need be applied between the chip and the substrate to provide the functionality of an underfill.

Thus, in accordance with the invention, the IC chip 1 bumps are composed of polymer bumps 2 formed from electrically conductive paste. Compared with other bumps, like solder bumps formed with a ball bonding method, or Au bumps formed with a plating method, the polymer bumps 2 provide unexpectedly superior performance. Specifically, the polymer bumps successfully enable piercing and displacement of the insulating adhesive film to a degree comparable with that of the metal bumps. This is enabled, in part, by heating of the polymer bumps as they are pressed against the adhesive, whereby the insulating adhesive is effectively displaced due to its lower viscosity. But in addition, the polymer bumps differ greatly from e.g., solder bumps or Au bumps in that during the bonding process the polymer bumps can be compressed to expand across the contact area of the electrodes 4 of the substrate 3. This substantially enhances the quality of the mechanical and electrical bond over that made with a conventional metal bump. This also enables a condition in which the chip is compressed against the adhesive layer on the substrate, thereby ensuring that the adhesive layer completely fills the volume between the chip and the substrate around the polymer bumps.

In addition, the polymer bumps have the characteristic that in the state where the bump surface is suitable for bonding, the material added to the polymer to render it electrically conducting, e.g., silver particles, provided as is conventional substantially homogeneously through the polymer bump, are deposited, i.e., are inherently found to exist, on the surface of the bump. The particles form minute concave and convex surface regions that aid in the piercing through and displacement of the substrate adhesive layer as the polymer bumps are pushed through the layer. As explained above, additional particles or flakes can be added to the polymer bump material to enhance its material properties for pushing through and displacing the substrate adhesive. Such is not generally available for conventional metal bump technology. There is also a notable difference between the polymer bumps and conventional metal bumps in that, during bonding, the bump resin paste plays the role of an adhesive, where conventional metal bumps generally do not provide an adhesive mechanism.

Therefore, even though minute through-holes are not provided in the insulating adhesive film 5 for inserting the polymer bumps 2 of the IC chip 1, direct bonding of the bumps to the substrate electrodes can be achieved by piercing the film with the bumps. The method thus makes the preparation of the insulating adhesive film 5 easier, thereby greatly improving the general applicability of the technique. Mechanically strong bonding of the chip to the substrate can be achieved with superior reliability.

It is therefore found that as described above, it is possible to directly bond IC chip polymer bumps to circuit board electrodes using an insulating film with no through-holes. This condition facilitates preparation of the insulating adhesive film, and markedly improves the general applicability of the technique. It also enables strong bonding in a state with adequate reliability.

Based on the discussion above, it is found that the flip chip mounting method of the invention accomplishes polymer bump-to-substrate bonding and chip-to-substrate underfilling simultaneously. The process therefore eliminates the need for an additional underfill step, eliminating the capital cost of equipment for the additional underfill step and resulting in increased production throughput and lower process cost. Because the electrically nonconducting adhesive layer can be formed and applied by any of a wide range of techniques, the mounting method of the invention enables production of flip chip assemblies on virtually any substrate material, including low-temperature plastics such as polyvinylchloride, as well as paper and other exotic substrate materials. The flexibility of the adhesive application also enables the mounting method to be automated for a selected process, e.g., for reel-to-reel processing where the adhesive layer is applied as a film that is first formed on a carrier substrate. The flexibility of the adhesive application also allows versatility in material formulation for application-specific considerations, e.g., with the inclusion of thermally-conductive fillers.

The operation of the flip chip mounting method of the invention in vertically compressing and laterally expanding polymer bumps as they are bonded to substrate electrodes substantially eliminates the production of voids between the bumps and the adhesive located around the bumps, due, e.g., to entrapped air, solvents, or other volatiles. The bump compression is a result of the pressing of the chip against the adhesive layer on the substrate, of the shrinking of the adhesive layer as it is fully polymerized, in the case of thermoset and B-stage thermoset adhesives, and of ease of lateral bump expansion against a softened adhesive, in the case of thermoplastic adhesives. As a result, the flip chip mounting method of the invention produces an underfill between the chip and the substrate that is more robust than conventional underfill materials that are dispensed between the chip and the substrate after the chip is bonded to the substrate. Virtually complete coverage of adhesive material between the flip chip and the substrate is enabled by the mounting method of the invention.

It is recognized, of course, that those skilled in the art may make various modifications and additions to the flip chip bonding techniques described above without departing from the spirit and scope of the present contribution to the art. Accordingly, it is to be understood that the protection sought to be afforded hereby should be deemed to extend to the subject matter of the claims and all equivalents thereof fairly within the scope of the invention.

We claim:

1. A method for mounting a flip chip on a substrate, comprising the steps of:
    applying a layer of electrically insulating adhesive paste on a substrate having bond pads, covering the bond pads with the adhesive;
    forming electrically conductive polymer bumps on bond pads of a flip chip;
    at least partially hardening the polymer bumps;
    aligning the bond pads of the flip chip with the bond pads of the substrate;
    pushing the at least partially hardened polymer bumps through the adhesive on the substrate to contact directly and bond the polymer bumps to the bond pads of the substrate.

2. The method of claim 1 further comprising a step of at least partially drying the adhesive paste applied to the substrate before the step of pushing the polymer bumps through the adhesive on the substrate.

3. The method of claim 1 wherein the step of at least partially hardening the polymer bumps comprises at least partially drying the polymer bumps.

4. The method of claim 1 wherein the step of at least partially hardening the polymer bumps comprises at least partially polymerizing the polymer bumps.

5. The method of claim 1 wherein the step of pushing the polymer bumps through the adhesive on the substrate further comprises applying heat to the flip chip as the bumps are pushed through the adhesive.

6. The method of claim 1 further comprising a step of applying heat to the flip chip after the polymer bumps contact the bond pads of the substrate.

7. The method of claim 1 wherein the step of pushing the polymer bumps through the adhesive on the substrate comprises applying pressure to the flip chip for a duration selected, based on material characteristics of the adhesive and of the polymer bumps, that vertically compresses the bumps between the flip chip and the substrate to a compressed height that is less than bump height as-formed.

8. The method of claim 7 wherein the compressed bump height is less than about 80% of bump height as-formed.

9. The method of claim 1 wherein the step of forming polymer bumps comprises forming polymer bumps each having a bump height that is greater than adhesive paste thickness as-applied on the substrate.

10. The method of claim 9 wherein the bump height is at least about 25% greater than adhesive paste thickness.

11. The method of claim 1 wherein the polymer bumps are formed of a thermoplastic material.

12. The method of claim 1 wherein the polymer bumps are formed of a thermoset material.

13. The method of claim 1 wherein the polymer bumps are formed of a B-stage thermoset material.

14. The method of claim 1 wherein the step of forming polymer bumps comprises stenciling polymer bumps.

15. The method of claim 1 wherein the step of forming polymer bumps comprises screen printing polymer bumps.

16. The method of claim 1 wherein the applied layer of insulating adhesive paste comprises a thermoplastic.

17. The method of claim 1 wherein the applied layer of insulating adhesive paste comprises a thermoset.

18. The method of claim 1 wherein the applied layer of insulating adhesive paste comprises a B-stage thermoset.

19. The method of claim 1 wherein the applied layer of insulating adhesive paste includes a solvent.

20. The method of claim 1 wherein the step of applying the adhesive paste to the substrate comprises stenciling the adhesive paste on the substrate.

21. The method of claim 1 wherein the step of applying the adhesive paste to the substrate comprises screen printing the adhesive paste on the substrate.

22. The method of claim 1 wherein the step of applying the adhesive paste to the substrate comprises dispensing the adhesive paste on the substrate.

23. The method of claim 1 wherein the step of applying the adhesive paste to the substrate comprises spin-coating the adhesive paste on the substrate.

24. The method of claim 1 wherein the formed polymer bumps include hard particles.

25. The method of claim 1 wherein the formed polymer bumps include particles having jagged edges and wherein edges of included particles protrude from bump surfaces.

26. The method of claim 25 wherein the particles included in the polymer bumps are electrically nonconductive.

27. The method of claim 25 wherein the particles included in the polymer bumps are electrically conductive.

* * * * *

UNITED STATES PATENT AND TRADEMARK OFFICE
CERTIFICATE OF CORRECTION

PATENT NO.    : 6,189,208 B1
DATED         : February 20, 2001
INVENTOR(S)   : Richard H. Estes, Koji Ito, Masanori Akita, Toshihiro Mori, and Minoru Wada It is certified that error appears in the above-identified patent and that said Letters Patent is hereby corrected as shown below:

<u>Title page,</u>
Item [30] Foreign Application Priority Data, should be included and read:
-- Sept. 11, 1998     (JP)     10-276668 --.

Signed and Sealed this

Second Day of April, 2002

Attest:

JAMES E. ROGAN
*Attesting Officer*          *Director of the United States Patent and Trademark Office*